United States Patent
Kim

(10) Patent No.: US 9,960,567 B2
(45) Date of Patent: May 1, 2018

(54) LASER DEVICE INTEGRATED WITH SEMICONDUCTOR OPTICAL AMPLIFIER ON SILICON SUBSTRATE

(71) Applicant: Samsung Electronics Co., Ltd., Suwon-Si, Gyeonggi-Do (KR)

(72) Inventor: Taek Kim, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 1170 days.

(21) Appl. No.: 14/453,070

(22) Filed: Aug. 6, 2014

(65) Prior Publication Data

US 2018/0090576 A1 Mar. 29, 2018

(30) Foreign Application Priority Data

Feb. 18, 2014 (KR) .................. 10-2014-0018655

(51) Int. Cl.
*H01S 5/026* (2006.01)
*H01S 5/028* (2006.01)
*H01S 5/0625* (2006.01)
*H01S 5/12* (2006.01)

(52) U.S. Cl.
CPC .............. *H01S 5/026* (2013.01); *H01S 5/028* (2013.01); *H01S 5/0265* (2013.01); *H01S 5/0287* (2013.01); *H01S 5/0625* (2013.01); *H01S 5/06256* (2013.01); *H01S 5/1209* (2013.01)

(58) Field of Classification Search
CPC ........ H01S 5/026; H01S 5/0265; H01S 5/028; H01S 5/0287; H01S 5/0625; H01S 5/06256

See application file for complete search history.

(56) References Cited

U.S. PATENT DOCUMENTS

| 6,895,134 | B2* | 5/2005 | Glogovsky | ............ G02B 6/132 257/14 |
|---|---|---|---|---|
| 2011/0157685 | A1* | 6/2011 | Sugawara | ................. H01S 5/12 359/328 |
| 2012/0002696 | A1* | 1/2012 | Oki | ........................ B82Y 20/00 372/50.22 |

FOREIGN PATENT DOCUMENTS

| JP | 2003-309322 A | 10/2003 |
|---|---|---|
| JP | 2004-186336 A | 7/2004 |
| JP | 2007-311463 A | 11/2007 |
| JP | 2013-093425 A | 5/2013 |
| WO | WO-2012-114074 A1 | 8/2012 |

* cited by examiner

*Primary Examiner* — Dung Nguyen
(74) *Attorney, Agent, or Firm* — Harness, Dickey & Pierce, P.L.C.

(57) ABSTRACT

A laser device includes a silicon substrate, a buffer layer on the silicon substrate, a laser cavity on the buffer layer including a first active region based on group III-V semiconductor quantum dots, and a semiconductor optical amplifier that is integrated with the laser cavity on the buffer layer, includes a second active region based on group III-V semiconductor quantum dots, and amplifies light emitted from the laser cavity.

23 Claims, 7 Drawing Sheets

LASER DEVICE INTEGRATED WITH SEMICONDUCTOR OPTICAL AMPLIFIER ON SILICON SUBSTRATE

RELATED APPLICATIONS

This application claims priority from Korean Patent Application No. 10-2014-0018655, filed on Feb. 18, 2014, in the Korean Intellectual Property Office, the disclosure of which is incorporated herein in its entirety by reference.

BACKGROUND

1. Field

Example embodiments relate to laser devices, and/or to laser devices formed of a group III-V-based semiconductor material on a silicon substrate, the group III-V-based semiconductor material having a low defect density.

2. Description of the Related Art

Interest in technologies for forming silicon-based photonic integrated circuits has recently increased. A silicon-based photonic integrated circuit may include various optical devices such as a light source, an optical waveguide, an optical modulator, an optical filter, and a photodetector, and may transmit a signal through optical interconnection. Optical interconnection is a technology of transmitting/receiving data by using light, and has less transmission loss and less electromagnetic wave interference than electrical interconnection. Thus, optical interconnection may be appropriately applied to a high-speed and high-bandwidth data transmission/reception system.

Various studies have been conducted to develop a laser device formed of a compound semiconductor on a silicon substrate, in order to use the laser device in data communication. Also, attempts to manufacture a laser device by growing a group III-V compound semiconductor on a silicon substrate by using an epitaxial method have been made for a long time. However, the laser devices that have been developed so far have limitations regarding the lifetime, output, and reliability because of defects caused by a difference in a lattice constant between the silicon substrate and the group III-V compound semiconductor. Furthermore, when such a laser device is used as a light source for optical communication, it is typically advantageous to use light in a wavelength band that is not absorbed into the silicon substrate. However, when a laser device of this wavelength band is formed of the group III-V compound semiconductor, more defects typically occur than when light having other wavelength bands is used.

SUMMARY

Examples embodiments relate to laser devices formed of a group III-V-based semiconductor material on a silicon substrate, the group III-V-based semiconductor material having a low defect density.

Additional example embodiments will be set forth in part in the description which follows and, in part, will be apparent from the description, or may be learned by practice of the presented embodiments.

According to at least one example embodiment, a laser device includes a silicon substrate, a buffer layer on the silicon substrate, a laser cavity on the buffer layer, the laser cavity including a first active region based on group III-V semiconductor quantum dots, and a semiconductor optical amplifier that is integrated with the laser cavity on the buffer layer and includes a second active region based on group III-V semiconductor quantum dots, and amplifies light that is emitted from the laser cavity.

The first active region may generate light having a wavelength band that is not absorbed into the silicon substrate.

The first active region may generate light having a wavelength band equal to or greater than about 1100 nm.

The buffer layer may be formed of, or include, a group III-V semiconductor material.

The buffer layer may include GaAs, InGaAs, InGaP, or GaP.

The laser device may further include a layer including Ge or SiGe between the silicon substrate and the buffer layer.

The laser cavity may include a lower clad layer on the buffer layer, the first active region on the lower clad layer, an upper clad layer on the first active region, and a front mirror region and a rear mirror region at both sides of the first active region, the front mirror region and the rear mirror region being arranged to form a resonant structure in a direction substantially perpendicular to a direction in which the lower clad layer, the first active region, and the upper clad layer are stacked.

Each of the lower clad layer and the upper clad layer may be formed of a semiconductor material having a bandgap that is greater than a bandgap of the first active region.

Each of the lower clad layer and the upper clad layer may include GaAs, GaP, AlGaAs, InGaP, or InGaAlP.

The laser device may further include a contact layer on the upper clad layer.

The laser device may further include a first contact metal layer on the contact layer, and a second contact metal layer on a portion of the lower clad layer or the buffer layer that is exposed by partially etching the contact layer, the upper clad layer, the first active region, and the lower clad layer.

The lower clad layer and the upper clad layer may extend to face the second active region, and the second active region may be disposed between the lower clad layer and the upper clad layer to be optically connected to the front mirror region.

Each of the front mirror region and the rear mirror region may be embedded between the lower clad layer and the upper clad layer and may have a grating structure that repeats in a direction parallel to a surface of the silicon substrate.

Each of the front mirror region and the rear mirror region may have a distributed Bragg reflector (DBR) structure.

Each of the front mirror region and the rear mirror region may have a two-dimensional (2D) photonic crystal structure.

An uneven pattern may be formed on a portion of at least one of the lower clad layer and the upper clad layer that faces the first active region.

Anti-reflection coating may be applied to a surface through which the light amplified by the semiconductor optical amplifier is emitted.

Mirror coating may be applied to a surface through which the light amplified by the semiconductor optical amplifier is emitted, to form an extended cavity having a resonant length that is greater than a resonant length of the laser cavity.

The example laser device may further include a grating mirror in the second active region in order to form an extended cavity having a resonant length that is greater than a resonant length of the laser cavity.

The example laser device may further include an electro-absorption modulator on the silicon substrate to be optically connected to the semiconductor optical amplifier, and may adjust a wavelength of the light that is amplified by the semiconductor optical amplifier.

The electro-absorption modulator may include a third active region having a bandgap that is greater than a bandgap of the first active region of the laser cavity.

The third active region may include group III-V semiconductor quantum dots.

The laser cavity may include a plurality of laser cavities that generate light having different wavelength bands, wherein the laser device further includes a plurality of waveguides that respectively guide the light emitted from the plurality of laser cavities, and a coupler that couples the light guided by the plurality of waveguides.

At least one example embodiment relates to a laser device including a substrate, a buffer layer on the substrate, a laser cavity on the buffer layer and including a front mirror region, a first active region and a rear mirror region, and a semiconductor optical amplifier on the buffer layer and including a second active region configured to amplify light emitted from the laser cavity.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1A:
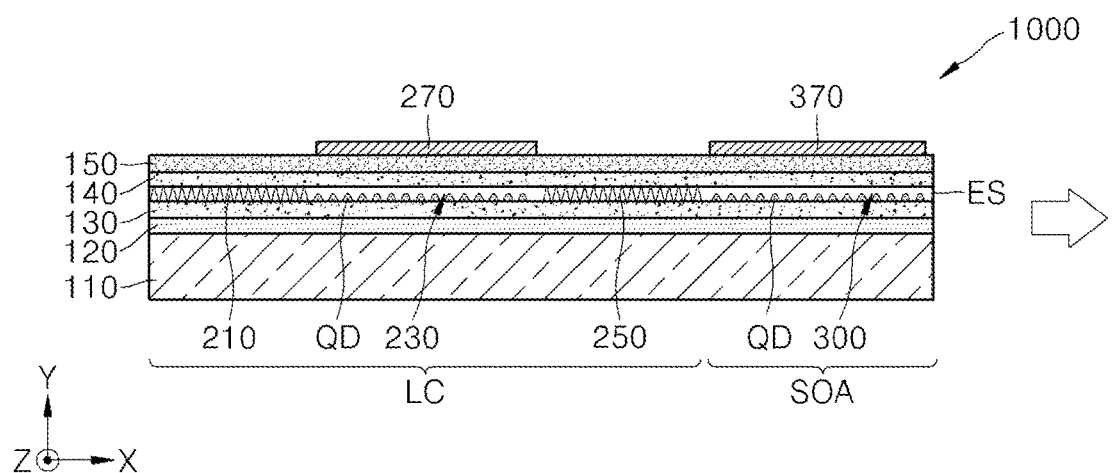
FIG. 1A is a cross-sectional view illustrating a structure of a laser device according to an example embodiment.

As used herein, the term "and/or" includes any and all combinations of one or more of the associated listed items. Expressions such as "at least one of," when preceding a list of elements, modify the entire list of elements and do not modify the individual elements of the list.

As the invention allows for various changes and numerous embodiments, particular embodiments will be illustrated in the drawings and described in detail in the written description. The advantages and features of the present invention and methods of achieving the advantages and features will be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and complete, and will fully convey the concept of the invention to one of ordinary skill in the art.

Hereinafter, the present invention will be described more fully with reference to the accompanying drawings, in which exemplary embodiments of the invention are shown. In the drawings, like elements are denoted by like reference numerals, and a repeated explanation thereof will not be given.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that the terms "comprises" and/or "comprising" used herein specify the presence of stated features or components, but do not preclude the presence or addition of one or more other features or components.

Sizes of elements may be exaggerated for convenience of explanation. In other words, since sizes and thicknesses of elements in the drawings are arbitrarily illustrated for convenience of explanation, the following embodiments are not limited thereto. In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the embodiments are merely described below, by referring to the figures, to explain example embodiments of the present description.

Figure 1B:
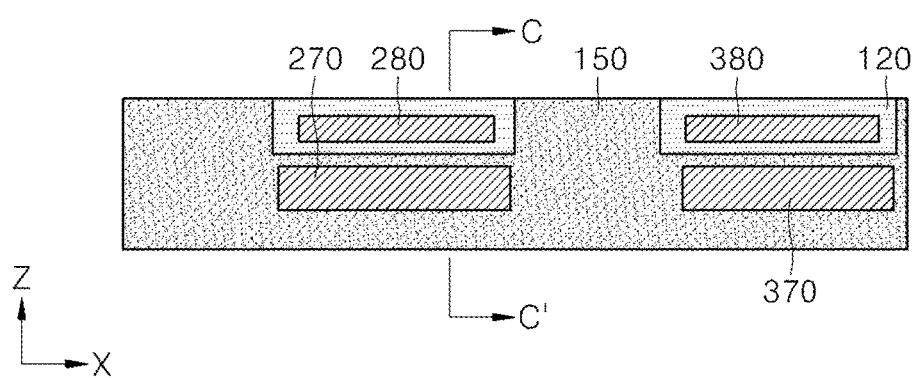
FIG. 1B is a plan view of FIG. 1A.

FIG. 1A is a cross-sectional view illustrating a structure of a laser device 1000 according to an example embodiment. FIG. 1B is a plan view of FIG. 1A. FIG. 1O is a cross-sectional view taken along line C-C' of FIG. 1B.

The laser device 1000 is constructed such that a laser cavity LC and a semiconductor optical amplifier SOA are integrated on a silicon substrate 110. The laser cavity LC and the semiconductor optical amplifier SOA are optically connected to each other, and thus light that is emitted from the laser cavity LC is additionally amplified by the semiconductor optical amplifier SOA and is emitted through an emission surface ES.

A crystal defect occurs when a group III-V compound semiconductor-based laser is formed on the silicon substrate 110. The number of crystal defects increases due to heat as an output of the laser device 100 increases. In the example embodiment, a quantum dot active layer is used for reducing the number of crystal defects. Also, the laser cavity LC and the semiconductor optical amplifier SOA are integrated on the silicon substrate 110 in order to perform an operation of low output and to dissipate heat.

A detailed structure of the laser device 1000 will now be explained.

A buffer layer 120 is formed on the silicon substrate 110, and the laser cavity LC and the semiconductor optical amplifier SOA are formed on the buffer layer 120.

According to at least one example embodiment, the buffer layer 120 is provided in order to reduce a difference in thermal expansion coefficient or a difference in lattice constant between the silicon substrate 110 and a thin film that is to be formed on the silicon substrate 110. For example, when a thin film formed of a group III-V compound semiconductor is formed on the silicon substrate 110, a defect occurs due to a difference in thermal expansion coefficient or lattice constant between the silicon substrate 110 and the thin film. The defect occurs as a dislocation due to a compressive stress or a crack due to a tensile stress. The buffer layer 120 may be formed of a group III-V semiconductor material in order to buffer the defect. For example, the buffer layer 120 may be formed of GaAs, or may include InGaP or InGaAs whose lattice constant is similar to that of GaAs.

Although the buffer layer 120 has a single-layer structure in FIGS. 1A through 1O, the example embodiment is not limited thereto and the buffer layer 120 may have a multi-layer structure. Also, a layer including germanium (Ge) or SiGe may be further disposed between the silicon substrate 110 and the buffer layer 120.

According to at least one example embodiment, the laser cavity LC disposed on the buffer layer 120 includes a lower clad layer 130, a first active region 230, and an upper clad layer 140. Also, a front mirror region 210 and a rear mirror region 250, which are disposed at both sides of the first active region 230 and form a resonant structure, are included in the laser cavity LC.

The first active region 230 may be configured to generate light having a wavelength band that is not absorbed into the silicon substrate 110, for example, light having a wavelength band equal to or greater than about 1100 nm, preferably, light having a wavelength band of about 1300 nm. When an active layer is formed as a general thin film, light having such a wavelength band may be generated from a material that is typically lattice-matched to InP, for example, InGaAsP or InGaAlAs. When the material is formed on the silicon substrate 110, more lattice defects occur than when an active layer is formed of a material for generating light having a wavelength band equal to or less than about 1000 nm.

According to at least one example embodiment, InAs or InGaAs-based quantum dots QD are used in order to generate light having a wavelength band equal to or greater than about 1100 nm and to reduce lattice defects. The quantum dots QD have advantages in that since a wavelength may be adjusted by using not only a bandgap of a material but also sizes of the quantum dots QD, light having a wavelength of about 1100 nm may be generated even on a GaAs layer that has a small difference in lattice constant from the silicon substrate 110. The first active region 230 may be formed as a group III-V compound semiconductor-based one or more quantum dot layers. Such a structure is generally referred to as a dots-in-a-well (DWELL) structure and includes the plurality of quantum dots QD distributed in a quantum well. A material corresponding to the quantum well may be, for example, $In_xGaAs$ or GaAs, and in this case, the quantum dots QD may be formed of $In_{x'}GaAs$ (x<x') or InAs. The DWELL structure may be formed as $In_{x'}GaAs$ (x<x') or InAs grows as the quantum dots QD on $In_xGaAs$ or GaAs. Although the quantum dots QD are formed as a single layer in FIGS. 1A through 10, the example embodiment is not limited thereto and the quantum dots QD may be stacked as a plurality of layers.

Each of the lower clad layer 130 and the upper clad layer 140 may be formed of a semiconductor material having a bandgap greater than a bandgap of the first active region 230. For example, each of the lower clad layer 130 and the upper clad layer 140 may include, for example, GaAs, GaP, AlGaAs, InGaP, or InGaAlP.

Figure 1C:
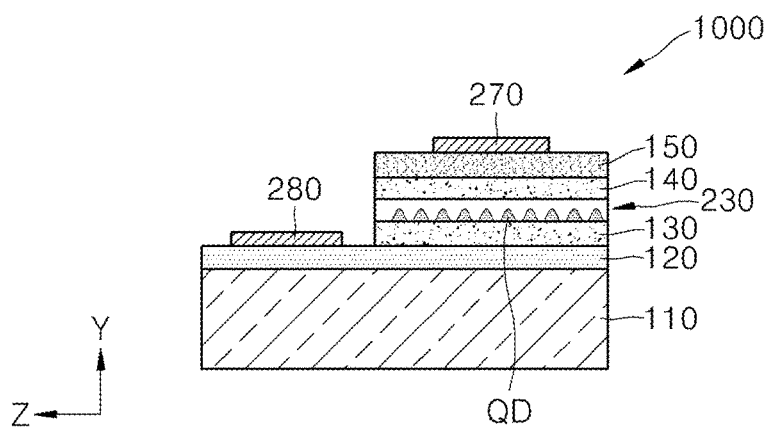
FIG. 1C is a cross-sectional view taken along line C-C' of FIG. 1B.

According to at least one example embodiment, the rear mirror region 250, the first active region 230, and the front mirror region 210 are arranged along a surface of the silicon substrate 110. That is, the rear mirror region 250, the first active region 230, and the front mirror region 210 are arranged in a direction (X direction) perpendicular to a direction (Y direction) in which the lower clad layer 130, the first active region 230, and the upper clad layer 140 are stacked. The front mirror region 210 and the rear mirror region 250 are configured to reflect light that is generated in the first active region 230, and/or to amplify and output light that satisfies a predetermined resonance condition. Each of the front mirror region 210 and the rear mirror region 250 has a grating pattern that repeats in the direction (X direction) parallel to the surface of the silicon substrate 110. A reflectance may be adjusted according to a shape or a cycle of the grating pattern. For example, the front mirror region 210 may be formed to have a reflectance ranging from about 10% to about 30%, and the rear mirror region 250 may be formed to have a reflectance equal to or greater than about 90%, but the example embodiment is not limited thereto. Also, each of the front mirror region 210 and the rear mirror region 250 may be embedded between the lower clad layer 130 and the upper clad layer 140 as shown in FIGS. 1A through 1C, but the example embodiment is not limited thereto.

According to at least one example embodiment, the semiconductor optical amplifier SOA is formed on the buffer layer 120 to be optically connected to the front mirror region 250 in order to amplify light that is emitted from the laser cavity LC. A second active region 300 of the semiconductor optical amplifier SOA is disposed between the lower clad layer 130 and the upper clad layer 140. That is, the lower clad layer 130 and the upper clad layer 140 that constitute the laser cavity LC extend toward the second active region 300 and are shared by the semiconductor optical amplifier SOA. Although the laser cavity LC and the semiconductor optical amplifier SOA are directly connected in FIGS. 1A through 1C, the example embodiment is not limited thereto and a device, for example, a waveguide, that may optically connect the laser cavity LC and the semiconductor optical amplifier SOA, may be further provided between the laser cavity LC and the semiconductor optical amplifier SOA.

The second active region 300 may include quantum dots QD, for example, group III-V compound semiconductor-based quantum dots QD. The second active region 300 for amplifying light that is emitted from the first active region 230 includes the quantum dots QD having sizes similar to the sizes of the quantum dots QD of the first active region 230. Accordingly, the second active region 300 has a bandgap similar to that of the first active region 230. When light that is emitted from the laser cavity LC is injected into the second active region 300, which operates at power lower than a threshold value for emitting light, the light is amplified and emitted through the emission surface ES. Anti-reflection coating may be applied to the emission surface ES.

A contact layer 150 may be further formed on the upper clad layer 140. The contact layer 150 may include GaAs, GaP, AlGaAs, InGaP, or InGaAs. Predetermined impurities may be doped into the contact layer 150 in order to allow a current to be easily injected into the first active region 230 and the second active region 300.

Each of a first contact metal layer 270 and a second contact metal layer 280 is formed as an electrode for injecting a current into the laser cavity LC. The first contact metal layer 270 may be formed on the contact layer 150, and the second contact metal layer 280 may be formed on a portion of the buffer layer 120 that is exposed by partially etching the contact layer 150, the upper clad layer 140, the first active region 230, and the lower clad layer 130. Although the second contact metal layer 280 is formed on the buffer layer 120 in FIGS. 1B and 1C, the example embodiment is not limited thereto and the second contact metal layer 280 may be formed on the lower clad layer 130 that remains after the lower clad layer 130 is etched, but not deep enough to expose the buffer layer 120.

Also, each of a third contact metal layer 370 and a fourth contact metal layer 380 is formed as an electrode for injecting current into the semiconductor optical amplifier SOA. The third contact metal layer 370 may be formed on the contact layer 150, and the fourth contact metal layer 380 may be formed on a portion of the buffer layer 120 that is exposed by partially etching the contact layer 150, the upper clad layer 140, the second active layer 300, and the lower clad layer 130. The fourth contact metal layer 380 may be formed on the lower clad layer 130 that remains after the lower clad layer 130 is etched, but not deep enough to expose the buffer layer 120, like the second contact metal layer 280.

The example laser device 1000 constructed as described above may operate with low power. For example, when the semiconductor optical amplifier SOA operates with power lower than a threshold value for emitting light, minimum power for emitting light is supplied to the laser cavity LC. The low-output light that is emitted from the laser cavity LC is incident on the semiconductor optical amplifier SOA that does not yet oscillate, and thus light that is amplified as the second active region 250 starts to oscillate is emitted through the emission surface ES. An output from the laser cavity LC is determined in consideration of a desired optical output from the laser device 1000, specifically, in consideration of an output required by an optical communication system or the like. Since the laser cavity LC operates with a low output, an increase in the number of crystal defects that occur in the laser cavity LC due to heat may be minimized and the laser device 1000 may have high reliability and long lifespan.

Figure 2:
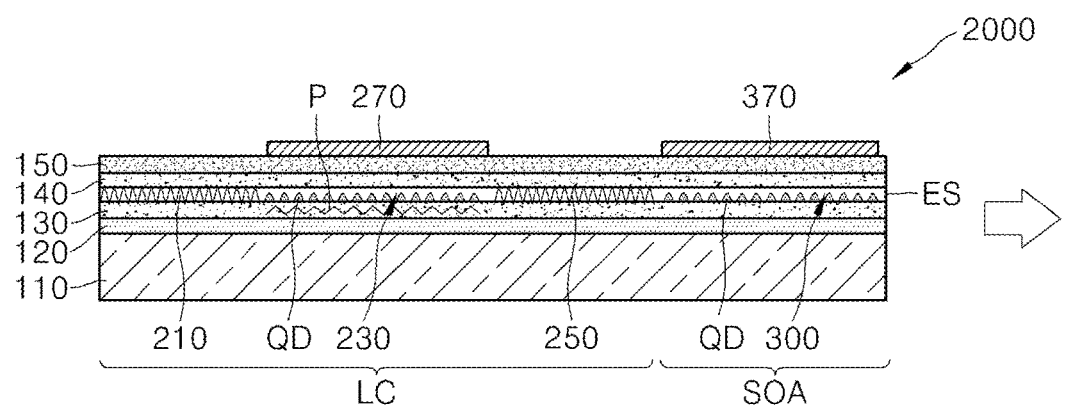
FIG. 2 is a cross-sectional view illustrating a structure of a laser device according to another example embodiment.

FIG. 2 is a cross-sectional view illustrating a structure of a laser device 2000 according to another example embodiment.

The laser device 2000 of FIG. 2 is substantially the same as or similar to the laser device 1000 of FIG. 1 except that an uneven pattern P is formed on a portion of the lower clad layer 130 that faces the first active region 230.

Figure 3:
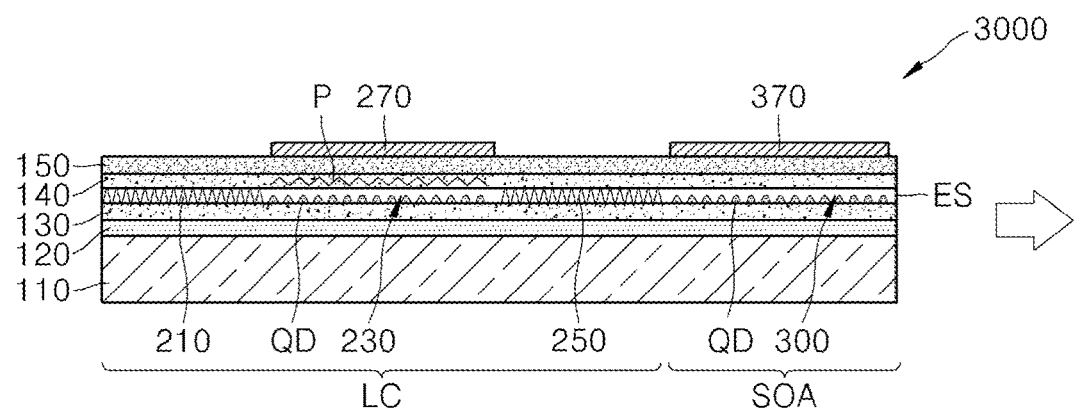
FIG. 3 is a cross-sectional view illustrating a structure of a laser device according to another example embodiment.

FIG. 3 is a cross-sectional view illustrating a structure of a laser device 3000 according to another example embodiment.

The laser device 3000 of FIG. 3 is substantially the same as or similar to the laser device 1000 of FIG. 1 except that an uneven pattern P is formed on a portion of an upper clad layer 140 that faces a first active region 230.

Each of the laser devices 2000 and 3000 of FIGS. 2 and 3 has a periodic structure along the first active region 230, and facilitates a single mode oscillation by using Bragg reflection due to the periodic structure. Although the uneven pattern P is formed on the lower clad layer 130 or the upper clad layer 140 in FIGS. 2 and 3, the uneven pattern P may be formed on both the lower clad layer 130 and the upper clad layer 140.

Figure 4:
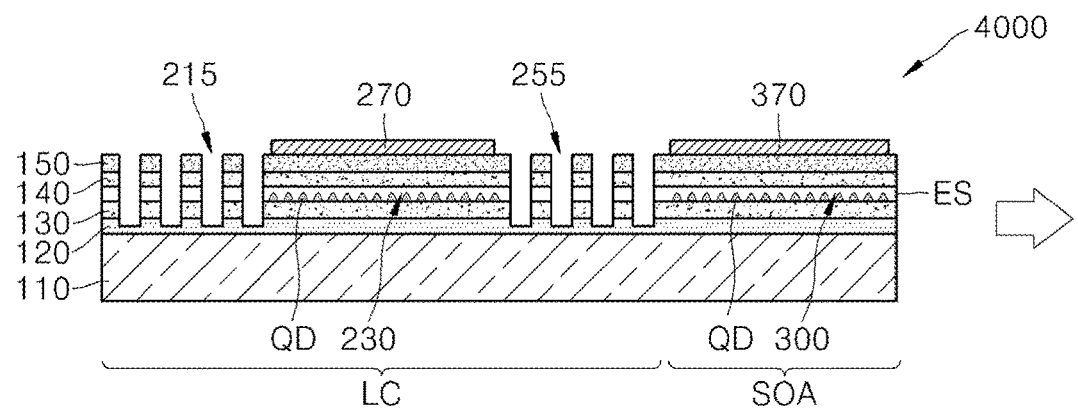
FIG. 4 is a cross-sectional view illustrating a structure of a laser device according to another example embodiment.

FIG. 4 is a cross-sectional view illustrating a structure of a laser device 4000 according to another example embodiment.

The laser device 4000 of FIG. 4 is different from the laser device 1000 of FIG. 1 in that a rear mirror region 215 and a front mirror region 255 are formed to have a distributed Bragg reflector (DBR) structure.

The DBR structure may be formed by alternating a high refractive index region and a low refractive index region and allowing a thickness of each of the high refractive index region and the low refractive index region to be about ¼ of a desired resonant wavelength. The DBR structure illustrated in FIG. 4 is a stacked structure formed from the buffer layer 120 to the contact layer 150, or between the buffer layer 120 and the contact layer 150, and etched into a regular pattern. An air region that is alternately formed by etching acts as the low refractive index region.

Figure 5:
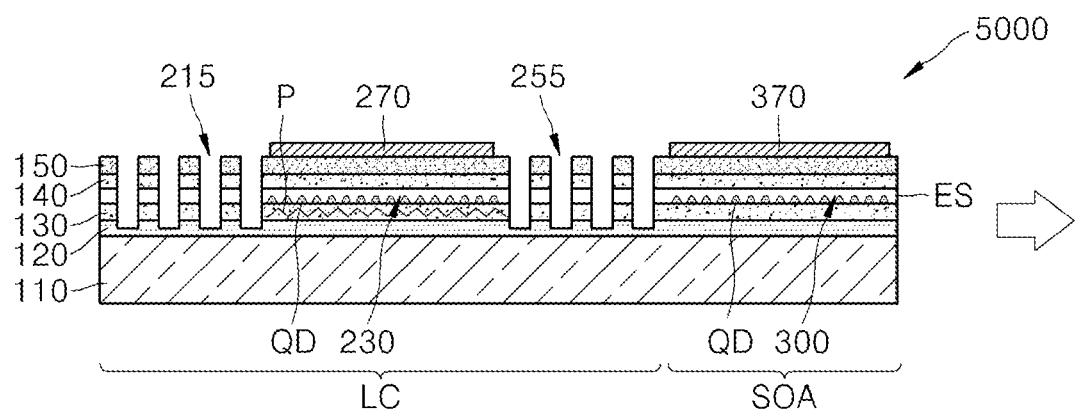
FIG. 5 is a cross-sectional view illustrating a structure of a laser device according to another example embodiment.

FIG. 5 is a cross-sectional view illustrating a structure of a laser device 5000 according to another example embodiment.

The laser device 5000 of FIG. 5 is different from the laser device 4000 of FIG. 4 in that the uneven pattern P is formed in the lower clad layer 130.

A rear mirror region 210 or 215 and a front mirror region 250 or 255 may be formed to have a two-dimensional (2D) photonic crystal structure as well as previously described embedded grating structure or the DBR structure.

Figure 6:
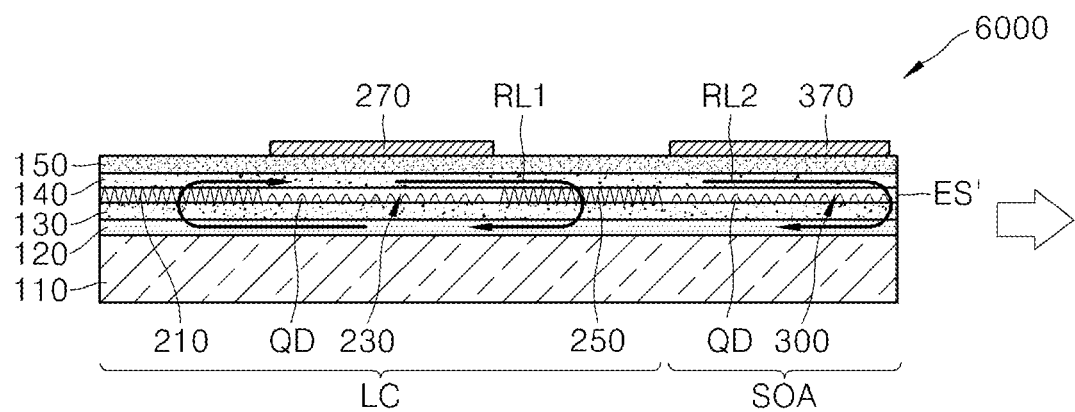
FIG. 6 is a cross-sectional view illustrating a structure of a laser device according to another example embodiment.

FIG. 6 is a cross-sectional view illustrating a structure of a laser device 6000 according to another example embodiment.

The laser device 6000 of FIG. 6 is different from the laser device 1000 of FIG. 1 in that a mirror coating is applied to an emission surface ES through which light that is amplified by a semiconductor optical amplifier SOA is emitted. In this case, an extended cavity is formed between a rear mirror region 210 and the emission surface ES to which the mirror coating is applied. A resonant length RL2 of the extended cavity is greater than a resonant length RL1 of the laser cavity LC. Light that is finally emitted from the laser device 6000 may satisfy not only an initial resonance condition of the laser cavity LC but also a resonance condition of the extended cavity including a length of the semiconductor optical amplifier SOA, and thus, wavelength selectivity may be further improved.

Figure 7:
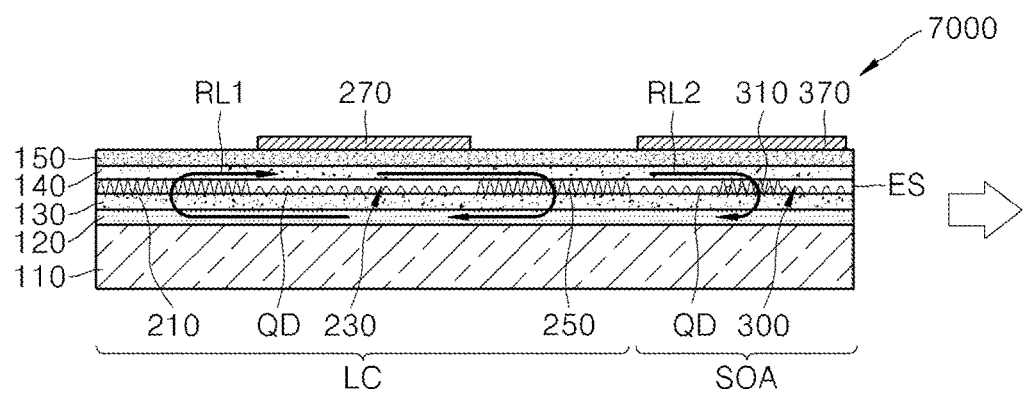
FIG. 7 is a cross-sectional view illustrating a structure of a laser device according to another example embodiment.

FIG. 7 is a cross-sectional view illustrating a structure of a laser device 7000 according to another example embodiment.

The laser device 7000 of FIG. 7 is different from the laser device 1000 of FIG. 1 in that a grating mirror 310 is further formed in a second active region 250. The laser device 7000 of FIG. 7 includes an extended cavity, like the laser device 6000 of FIG. 6. In this case, the extended cavity is formed between a rear mirror region 210 and a grating mirror 310. The resonant length RL2 of the extended cavity is greater than the resonant length RL1 of the laser cavity LC. Light that is finally emitted from the laser device 7000 may satisfy not only an initial resonance condition of the laser cavity LC but also a resonance condition of the extended cavity including a length between the laser cavity LC and the grating mirror 310, and thus, wavelength selectivity may be further improved.

Each of the laser devices 6000 and 7000 of FIGS. 6 and 7 may include the extended cavity. Although the extended cavity is formed in the laser device 1000, the extended cavity may be formed in any of the laser devices 2000, 3000, 4000, and 5000 of FIGS. 2 through 5 or a combination thereof.

Figure 8:
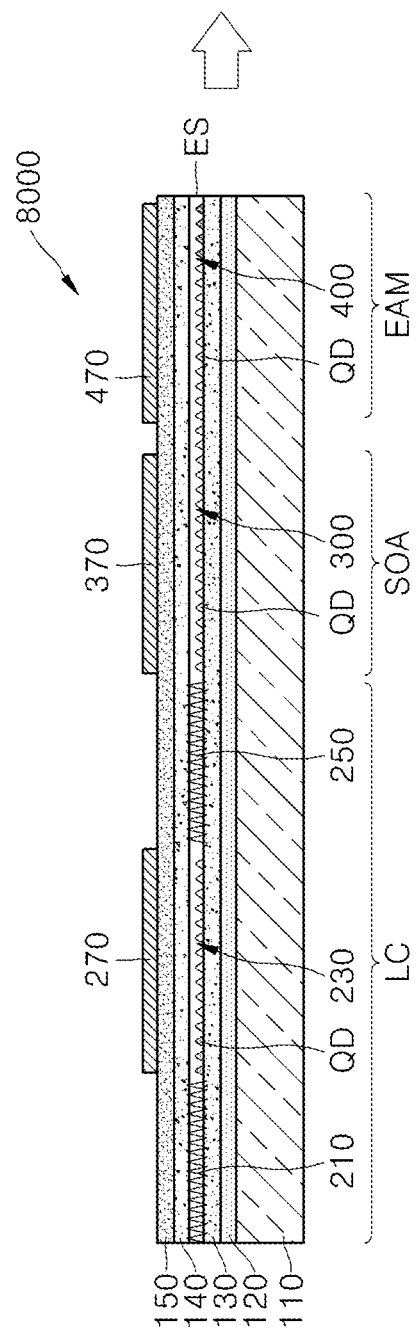
FIG. 8 is a cross-sectional view illustrating a structure of a laser device according to another example embodiment.

FIG. 8 is a cross-sectional view illustrating a structure of a laser device 8000 according to another example embodiment.

The laser device 8000 of FIG. 8 is different from the laser device 1000 of FIG. 1 in that an electro-absorption modulator EAM for adjusting a wavelength of light that is amplified by a semiconductor optical amplifier SOA is further provided.

The electro-absorption modulator EAM is formed on a silicon substrate 110 to be optically connected to the semiconductor optical amplifier SOA. The electro-absorption modulator EAM includes a third active region 400 having a bandgap greater than a bandgap of a first active region 230 of a laser cavity LC. The third active region 400 may include group III-V compound semiconductor-based quantum dots QD, and in this case, a bandgap is adjusted by adjusting sizes of the quantum dots QD.

The electro-absorption modulator EAM shares a lower clad layer 130 and an upper clad layer 140 with the laser cavity LC and the semiconductor optical amplifier SOA, and a third active region 400 is formed between the lower clad layer 130 and the upper clad layer 140. Accordingly, when the laser cavity LC and the semiconductor optical amplifier SOA are formed, the electro-absorption modulator EAM may also be integrated. The electro-absorption modulator EAM adjusts a wavelength of light that is finally emitted from the emission surface ES of the laser device 8000 by using a phenomenon where an optical absorption coefficient varies according to an electric field.

A fifth contact metal layer 470 may be formed on the contact layer 150 as an electrode for forming an electric field on the third active region 400. Also, a sixth contact metal layer (not shown) may be formed on a portion of the buffer layer 120 or the lower clad layer 130 that is exposed by partially etching the contact layer 150, the upper clad layer 140, the third active region 400, and the lower clad layer 130, similarly to the second contact metal layer 280 and the fourth contact metal layer 380 of FIG. 1B.

According to at least one example embodiment, during operation of the laser device 800, a forward voltage is applied to the laser cavity LC and the semiconductor optical amplifier SOA and a backward voltage is applied to the electro-absorption modulator EAM. Light that is emitted from the laser cavity LC and is amplified by the semiconductor optical amplifier SOA, passes through the electro-absorption modulator EAM, absorption and transmittance thereof being adjusted, and then is emitted through the emission surface ES.

Although the laser device 8000 is illustrated as adding the electro-absorption modulator EAM to the laser device 1000 of FIG. 1, the example embodiment is not limited thereto and the electro-absorption modulator EAM may be further included in any of the laser devices 2000 through 7000 of FIGS. 2 through 7 or a combination thereof.

Figure 9:
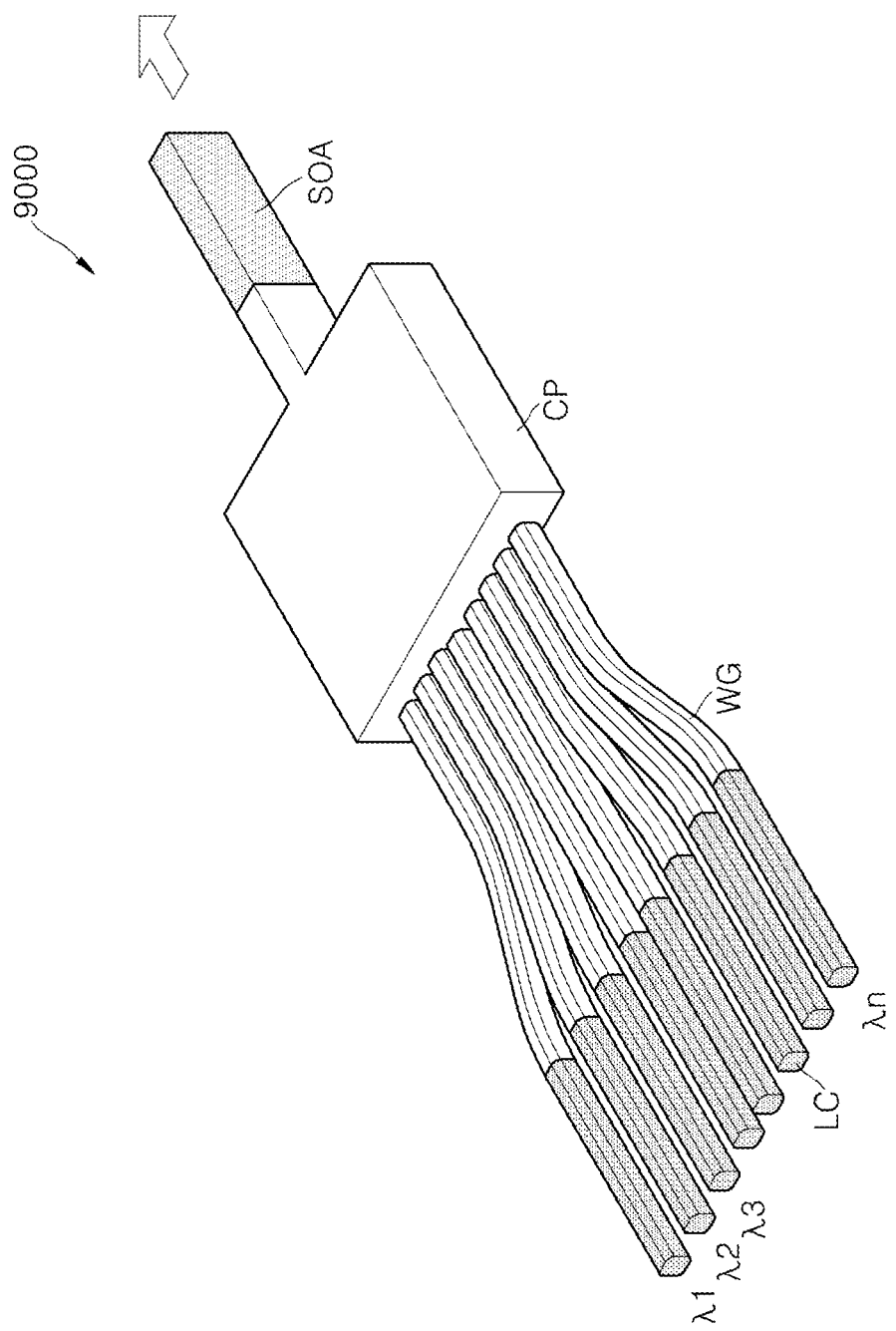
FIG. 9 is a perspective view illustrating an outer appearance of a laser device according to another example embodiment.

FIG. 9 is a perspective view illustrating an outer appearance of a laser device 9000 according to another example embodiment.

The laser device 9000 of FIG. 9 is a multi-wavelength output device and includes a plurality of laser cavities LC that generate light having different wavelength bands, a plurality of waveguides WG that respectively guide light emitted from the plurality of laser cavities LC, a coupler CP that couples the light guided by the plurality of waveguides WG, and a semiconductor optical amplifier SOA that amplifies the light incident from the coupler CP.

Each of the plurality of laser cavities LC may be the laser cavity LC described above. A material or a size of each of quantum dots that form an active layer and a resonant length of each of the laser cavities LC are determined according to wavelengths λ1 through λn of light to be oscillated. The plurality of laser cavities LC may have similar bandgaps, that is, the quantum dots may be formed of similar materials to have similar sizes, and light having different wavelengths may be oscillated by varying resonant lengths.

The semiconductor optical amplifier SOA may have the structure presented above, and an active layer and a full width at half maximum (FWHM) of light that is emitted from the active layer may be designed to amplify the light having the wavelengths λ1 through λn generated in the plurality of laser cavities LC. The active layer of the semiconductor optical amplifier SOA may also include quantum dots having similar sizes and including similar materials in order to have a bandgap similar to that of the active layer of the plurality of laser cavities LC. In general, light that is emitted from an active layer has an FWHM of 40 nm to 80 nm, and this light is amplified in the laser cavity LC as light having FWHM of 1 nm or less, and emitted. Accordingly, the semiconductor optical amplifier SOA may amplify light having various wavelengths emitted from the plurality of laser cavities LC, and may increase or decrease an FWHM in a range including the various wavelengths, as necessary.

According to the one or more example embodiments, a laser device includes a quantum dot active layer that is formed of a group III-V compound semiconductor and is disposed on a silicon substrate, and a semiconductor optical amplifier is optically connected to the quantum dot active layer. Accordingly, a high output of a desired level may be provided at a low driving voltage, thereby improving the reliability of the laser device and also extending the lifespan of the laser device.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A laser device comprising:
    a silicon substrate;
    a buffer layer on the silicon substrate;
    a laser cavity on the buffer layer, the laser cavity including
        a first active region including group III-V semiconductor quantum dots, and a front mirror region and a rear mirror region at both sides of the first active region, the front mirror region and the rear mirror region being spaced apart from each other in a direction parallel to the buffer layer; and
    a semiconductor optical amplifier integrated with the laser cavity on the buffer layer and having a second active region including group III-V semiconductor quantum dots, and configured to amplify light emitted from the laser cavity.

2. The laser device of claim 1, wherein the light generated by the first active region has a wavelength band that is not absorbed by the silicon substrate.

3. The laser device of claim 2, wherein the light generated by the first active region has a wavelength band equal to or greater than about 1100 nm.

4. The laser device of claim 1, wherein the buffer layer comprises a group III-V semiconductor material.

5. The laser device of claim 4, wherein the buffer layer comprises GaAs, InGaAs, InGaP, or GaP.

6. The laser device of claim 1, further comprising a layer including Ge or SiGe between the silicon substrate and the buffer layer.

7. The laser device of claim 1, wherein the laser cavity comprises:
    a lower clad layer on the buffer layer;
    the first active region on the lower clad layer;
    an upper clad layer on the first active region; and
    the front mirror region and the rear mirror region forming
        a resonant structure in a direction perpendicular to a direction in which the lower clad layer, the first active region, and the upper clad layer are stacked.

8. The laser device of claim 7, wherein at least one of the lower clad layer and the upper clad layer comprises a semiconductor material having a bandgap that is greater than a bandgap of the first active region.

9. The laser device of claim 8, wherein at least one of the lower clad layer and the upper clad layer comprises GaAs, GaP, AlGaAs, InGaP, or InGaAlP.

10. The laser device of claim 8, further comprising a contact layer on the upper clad layer.

11. The laser device of claim 10, further comprising:
    a first contact metal layer on the contact layer; and
    a second contact metal layer on a portion of the lower clad layer, or on a portion of the buffer layer that is exposed by partially etching the contact layer, the upper clad layer, the first active region, and the lower clad layer.

12. The laser device of claim 7, wherein the lower clad layer and the upper clad layer face the second active region, and
    wherein the second active region is between the lower clad layer and the upper clad layer and is optically connected to the front mirror region.

13. The laser device of claim 7, wherein at least one of the front mirror region and the rear mirror region is embedded between the lower clad layer and the upper clad layer and has a grating structure that repeats in a direction parallel to a surface of the silicon substrate.

14. The laser device of claim 7, wherein at least one of the front mirror region and the rear mirror region has a distributed Bragg reflector (DBR) structure.

15. The laser device of claim 7, wherein at least one of the front mirror region and the rear mirror region has a two-dimensional (2D) photonic crystal structure.

16. The laser device of claim 7, wherein a portion of at least one of the lower clad layer and the upper clad layer that faces the first active region includes an uneven pattern.

17. The laser device of claim 1, further comprising an anti-reflection coating on a surface through which the light amplified by the semiconductor optical amplifier is emitted.

18. The laser device of claim 1, further comprising a mirror coating on a surface through which the light amplified by the semiconductor optical amplifier is emitted, the mirror coating forming an extended cavity having a resonant length greater than a resonant length of the laser cavity.

19. The laser device of claim 1, further comprising an electro-absorption modulator on the silicon substrate optically connected to the semiconductor optical amplifier, the electro-absorption modulator being configured to adjust a wavelength of the light amplified by the semiconductor optical amplifier.

20. The laser device of claim 19, wherein the electro-absorption modulator comprises a third active region having a bandgap greater than a bandgap of the first active region of the laser cavity.

21. The laser device of claim 20, wherein the third active region comprises group III-V semiconductor quantum dots.

22. A laser device comprising:
   a silicon substrate;
   a buffer layer on the silicon substrate;
   a laser cavity on the buffer layer, the laser cavity including a first active region including group III-V semiconductor quantum dots;
   a semiconductor optical amplifier integrated with the laser cavity on the buffer layer and having a second active region including group III-V semiconductor quantum dots, and configured to amplify light emitted from the laser cavity; and
   a grating mirror in the second active region, the grating mirror forming an extended cavity having a resonant length greater than a resonant length of the laser cavity.

23. A laser device comprising:
   a silicon substrate;
   a buffer layer on the silicon substrate;
   a laser cavity on the buffer layer, the laser cavity including a first active region including group III-V semiconductor quantum dots; and
   a semiconductor optical amplifier integrated with the laser cavity on the buffer layer and having a second active region including group III-V semiconductor quantum dots, and configured to amplify light emitted from the laser cavity,
wherein the laser cavity comprises a plurality of laser cavities configured to generate light, the plurality of laser cavities having different wavelength bands,
   wherein the laser device further comprises:
      a plurality of waveguides configured to respectively guide the light emitted from the plurality of laser cavities; and
      a coupler configured to couple the light guided by the plurality of waveguides.

* * * * *